(12) United States Patent
Parker

(10) Patent No.: US 6,736,386 B1
(45) Date of Patent: May 18, 2004

(54) COVERED PHOTOMASK HOLDER AND METHOD OF USING THE SAME

(75) Inventor: Jeffrey B. Parker, Kokomo, IN (US)

(73) Assignee: DuPont Photomasks, Inc., Round Rock, TX (US)

( * ) Notice: Subject to any disclaimer, the term of this patent is extended or adjusted under 35 U.S.C. 154(b) by 124 days.

(21) Appl. No.: 10/116,431

(22) Filed: Apr. 4, 2002

Related U.S. Application Data

(60) Provisional application No. 60/282,743, filed on Apr. 10, 2001.

(51) Int. Cl.[7] ................................................. B25B 5/16
(52) U.S. Cl. ........................... 269/285; 269/216; 269/6; 29/559; 29/281.1; 206/316.1
(58) Field of Search .................... 29/559, 758, 270, 29/278, 281.1; 269/6, 165, 188, 271, 257, 285, 216, 903; 355/75; 81/487; 438/942, 943; 206/710, 832, 316.1; 118/503

(56) References Cited

U.S. PATENT DOCUMENTS

| | | | | |
|---|---|---|---|---|
| 3,618,929 A | * | 11/1971 | Upchurch | 269/6 |
| 3,949,131 A | | 4/1976 | Fraser | 428/201 |
| 4,201,374 A | | 5/1980 | Gras | 269/37 |
| 4,624,557 A | * | 11/1986 | Winn | 355/75 |
| 4,641,930 A | * | 2/1987 | Podvin et al. | 359/391 |
| 4,646,418 A | | 3/1987 | Hattori | 29/559 |
| 4,699,555 A | * | 10/1987 | Guarino | 414/217 |
| 4,703,920 A | | 11/1987 | Grabbe et al. | 269/37 |
| 4,730,386 A | * | 3/1988 | Fieberg et al. | 29/758 |
| 4,746,256 A | | 5/1988 | Boyle et al. | 414/217 |
| 4,820,930 A | * | 4/1989 | Tsutsui et al. | 250/548 |
| 4,842,136 A | | 6/1989 | Nakazato et al. | 206/328 |
| 4,847,119 A | * | 7/1989 | Chin et al. | 427/282 |
| 5,042,655 A | * | 8/1991 | Beldyk et al. | 206/316.1 |
| 5,100,957 A | | 3/1992 | Oshima et al. | 525/61 |
| 5,118,153 A | | 6/1992 | Allison et al. | 294/64.1 |
| 5,168,993 A | * | 12/1992 | Yen | 206/316.1 |
| 5,169,132 A | * | 12/1992 | Myers et al. | 269/6 |
| 5,320,225 A | | 6/1994 | Kirkpatrick | 206/449 |
| 5,330,053 A | | 7/1994 | Tabuchi et al. | 206/455 |
| 5,353,934 A | | 10/1994 | Yamauchi | 206/454 |
| 5,391,231 A | | 2/1995 | Schertler | 118/503 |
| 5,493,150 A | * | 2/1996 | Matsuoka et al. | 257/668 |
| 5,556,477 A | * | 9/1996 | Nahring et al. | 118/728 |
| 5,727,685 A | * | 3/1998 | Laganza et al. | 206/455 |
| 5,749,469 A | * | 5/1998 | Williams | 206/710 |
| 5,820,950 A | * | 10/1998 | Wang | 428/14 |
| 5,953,107 A | * | 9/1999 | Li et al. | 355/77 |
| 6,082,497 A | | 7/2000 | Nichols | 187/263 |
| 6,239,863 B1 | | 5/2001 | Catey et al. | 355/75 |
| 6,249,960 B1 | * | 6/2001 | Faesel | 29/762 |

* cited by examiner

*Primary Examiner*—David P. Bryant
(74) *Attorney, Agent, or Firm*—Baker Botts L.L.P.

(57) ABSTRACT

A covered photomask holder and a method of using the covered photomask holder are disclosed. A photomask holder includes a gripping mechanism to engage and retain a component with the photomask holder. A handle is coupled to the gripping mechanism that manipulates the gripping mechanism. A protective cover is associated with the gripping mechanism that encloses the component while engaged within the photomask holder.

21 Claims, 2 Drawing Sheets

COVERED PHOTOMASK HOLDER AND METHOD OF USING THE SAME

CROSS REFERENCE TO RELATED APPLICATION

This application claims priority from U.S. Provisional Patent Application Serial No. 60/282,743 filed Apr. 10, 2001, and entitled "Covered Reticle Holder and Method of Using the Same."

TECHNICAL FIELD OF THE INVENTION

This invention relates in general to the field of photolithography and, more particularly, to a covered photomask assembly holder and method of using the same.

BACKGROUND OF THE INVENTION

Photomasks, also known as reticles or masks, are used to transfer a pattern representing integrated circuits (ICs) onto a semiconductor wafer. Typically, a photomask is formed from a photomask blank using a standard photolithographic process. Producing a photomask from a photomask blank typically requires a lengthy number of steps including, but not limited to, processing, testing, packaging, and labeling. As a result of this lengthy process, photomasks require frequent handling in a photomask shop, especially when being loaded into a manufacturing tool. Presently, photomasks are handled either by hand or by a mechanical grabbing mechanism commonly known in the industry as a "pick." Conventional picks contain a handle and two grips that may be manually placed around the perimeter of a photomask.

At least two potential risks exist for damaging a photomask as the photomask is handled and moved around a photomask shop. First, a risk may exist if the photomask comes in contact with an object that scratches a surface of the photomask. While a scratch may be removed during a photomask repair process, each repair process adds time and cost to the manufacturing process. Second, another risk may exist if an uncovered photomask is moved around the photomask shop and small particles of foreign material settle on a surface of the photomask. These particles may damage the photomask or interfere with the production of ICs on a semiconductor wafer.

SUMMARY OF THE INVENTION

In accordance with the teachings of the present invention, disadvantages and problems associated with photomask holders have been substantially reduced or eliminated. In one particular embodiment, a covered photomask holder includes a gripping mechanism that may engage and retain a photomask component within the covered photomask holder. The holder may further include a handle coupled to the gripping mechanism operable to manipulate the gripping mechanism. A protective cover associated with the gripping mechanism may enclose the photomask component while the photomask component is engaged within the photomask holder.

In another embodiment of the present invention, a method for using a photomask holder with a photomask assembly includes placing the photomask holder around the photomask assembly. The method further includes positioning a transparent cover associated with the photomask holder over a surface of the photomask assembly.

Important technical advantages of certain embodiments of the present invention include a covered photomask holder that protects a photomask assembly or a photomask component from being damaged during a photomask or semiconductor manufacturing process. The photomask holder may include a gripping mechanism with a transparent protective cover. The cover may be placed over a patterned surface and possibly below an uncoated surface of a photomask assembly or component. Handling the photomask assembly or component with the protective covers over the photomask assembly or component may prevent scratches or other damage from contact with an object or contamination by any foreign particles during the transfer between manufacturing tools.

Another important technical advantage of the present invention includes a photomask holder that has a locking mechanism for a gripping mechanism that prevents accidental release of a photomask assembly or component from the gripping mechanism. Once the photomask assembly or component is retained within the photomask holder, the locking mechanism may be engaged to prevent the gripping mechanism on the holder from opening. Thus, the photomask assembly or component will be prevented from falling out of the holder due to an accidental release of the gripping mechanism.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Figure 1:
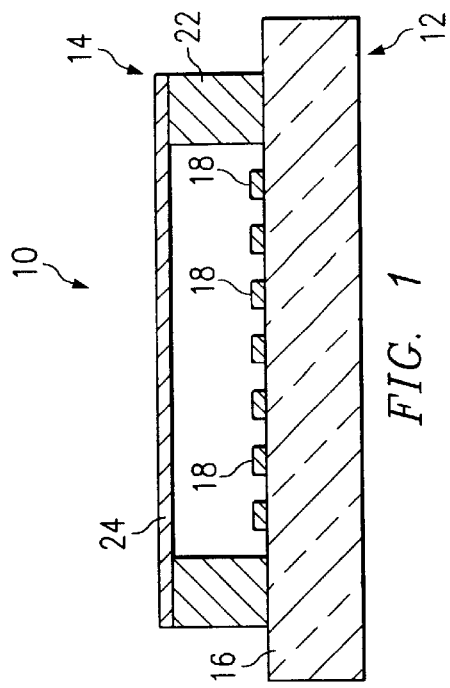
FIG. 1 illustrates a cross-sectional view of a photomask assembly according to the teachings of the present invention.
Figure 2:
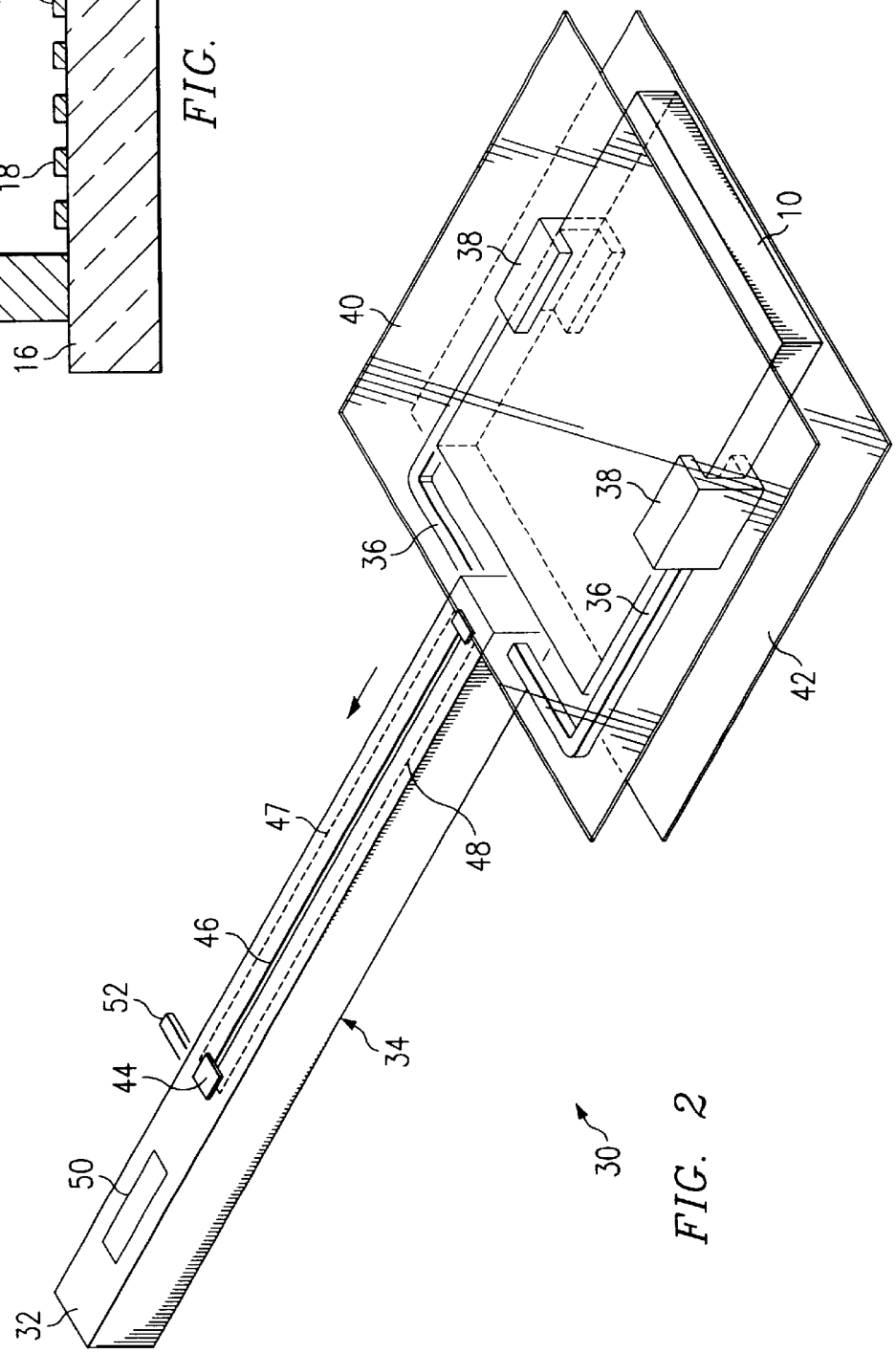
FIG. 2 illustrates a cross-sectional schematic representation of a photomask assembly holder according to the teachings of the present invention.
Figure 3:
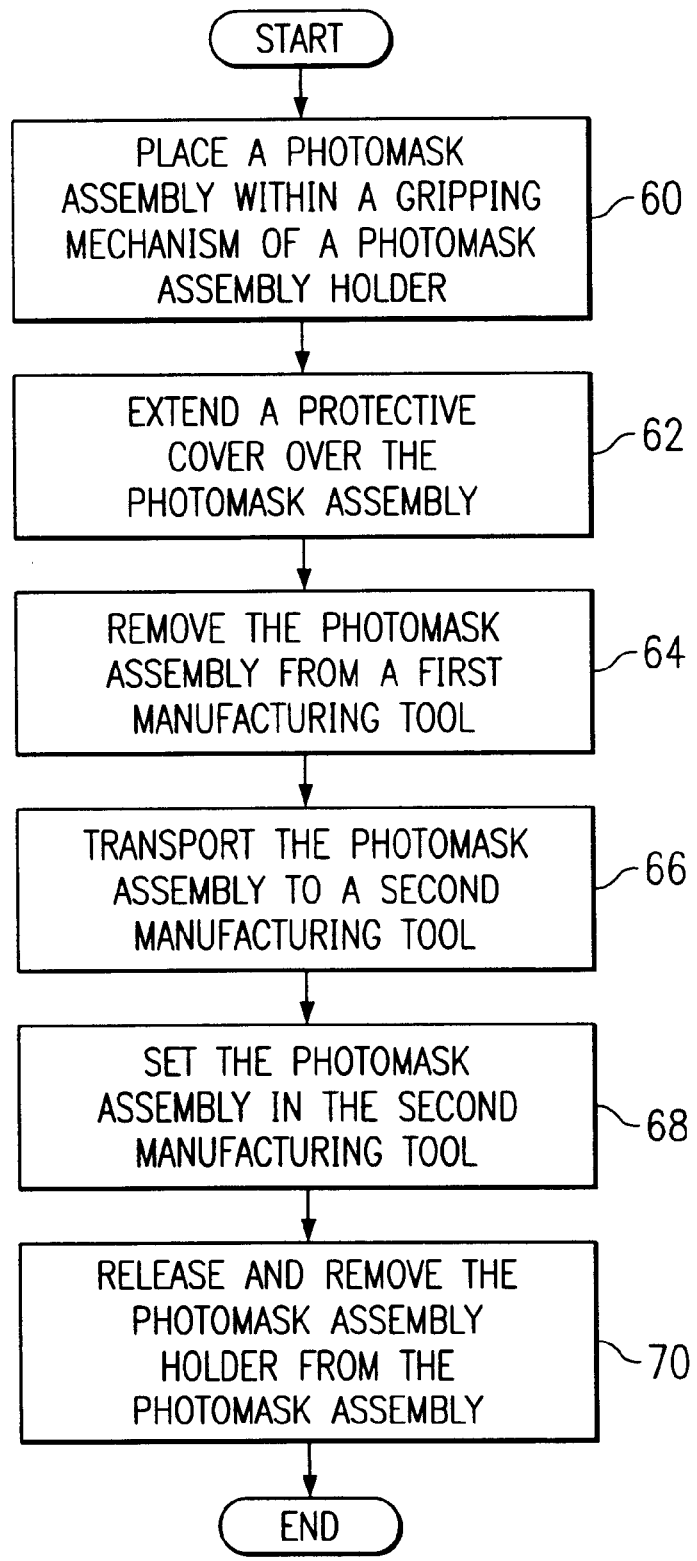
FIG. 3 illustrates a flow diagram of a method for transporting a photomask assembly between manufacturing tools using a photomask assembly holder according to the teachings of the present invention.

Preferred embodiments of the present invention and their advantages are best understood by reference to FIGS. 1 through 3, where like numbers are used to indicate like and corresponding parts.

FIG. 1 illustrates a cross-sectional view of photomask assembly 10. In the illustrated embodiment, photomask assembly 10 includes photomask 12 coupled to pellicle 14. Substrate 16 and patterned layer 18 form photomask 12, otherwise known as a mask or reticle. Photomask 12 may have a variety of sizes and shapes, including but not limited to round, rectangular, or square. Photomask 12 may also be any variety of photomask types, including, but not limited to, a one-time master, a five-inch reticle, a six-inch reticle or a nine-inch reticle. Photomask 12 may further be a binary mask, a phase shift mask, or any other type of mask suitable for use in a photolithography system.

Substrate 16 may be a transparent material such as quartz, synthetic quartz, fused silica, magnesium fluoride ($MgF_2$), calcium fluoride (CaF$_2$), or any other suitable material that transmits approximately seventy-five percent (75%) of incident light having a wavelength between approximately 10 nanometers (nm) and approximately 450 nm. In an alternative embodiment, substrate 16 may be a reflective material such as silicon or any other suitable material that produces a reflectance at the exposure wavelength of greater than approximately fifty percent (50%). Patterned layer 18 may be a metal material such as chrome, chromium nitride, a metallic oxy-carbo-nitride where the metal is selected from the group consisting of chromium, cobalt iron, zinc, molybdenum, niobium, tantalum, titanium, tungsten, aluminum, magnesium, silicon, and any other suitable material that absorbs light with wavelengths between approximately 120 nm and approximately 450 nm. In an alternative embodiment, patterned layer 18 may be a partially transmissive material, such as molybdenum silicide (MoSi), which has a transmissivity of approximately one percent (1%) to approximately thirty percent (30%).

Pellicle 14 typically includes pellicle frame 22 and pellicle film 24. Pellicle film 24 may be a thin film membrane formed of a material such as nitrocellulose, cellulose acetate, an amorphous fluoropolymer such as Teflon® AF manufactured by E. I. du Pont de Nemours and Company or Cytop® manufactured by Asahi Glass, or any other film suitable for use with deep ultraviolet, extreme ultraviolet or vacuum ultraviolet wavelengths. Pellicle film 24 may be prepared by a conventional technique such as spin casting. Pellicle frame 22 is typically formed of anodized aluminum, although it could alternatively be formed of stainless steel, plastic or any other suitable material. In operation, pellicle film 24 is designed to allow a large percentage of the radiant energy to pass through it in order to produce a high quality image from patterned layer 18.

Because the features of a photomask assembly are critical to forming an IC device, a photomask assembly and associated components need to be protected from damage while being handled in a mask shop. Another potential for damage may occur during the transfer of the photomask assembly or associated components from a first manufacturing tool to a second manufacturing tool. To prevent a photomask assembly from being damaged, a covered photomask holder formed in accordance with teachings of the present invention may be used to protect the photomask assembly during a semiconductor manufacturing process, such as transporting the photomask assembly between tools and handling photomask components in a mask shop during manufacture of the photomask assembly. Photomask holders formed in accordance with teachings of the present invention may be used to satisfactorily move or transport a photomask assembly and/or components associated with a photomask assembly. Such photomask holders may also be satisfactorily used to move or transport a semiconductor wafer.

Components associated with a photomask assembly include, but are not limited to, substrates, photomask blanks, photomasks, reticles, pellicles and pellicle frames.

FIG. 2 illustrates a cross-sectional schematic representation of photomask holder 30. In certain embodiments, photomask holder 30 may include handle 32, gripping mechanism 34, and protective cover 40. Gripping mechanism 34 may include gripping arm 36 and gripping pad 38 placed on gripping arm 36. Gripping mechanism 34 may include round, square, off-center, angled, or any other type of grips suitable to hold photomask assembly 10. In certain embodiments, gripping mechanism 34 may include two gripping arms 36 that oppose each other for engaging opposite edges of photomask assembly 10. Gripping arms 36 may also be satisfactorily used to engage opposite edges of components associated with a photomask and opposite edges or opposite portions of a semiconductor wafer.

Handle 32 may be used to manipulate and control gripping mechanism 34 for placing gripping arm 36 into contact with photomask assembly 10. Photomask holder 30 may also utilize a mechanical arm such as handle 32. By manipulating gripping mechanism 34 with handle 32, photomask assembly holder 30 may retain photomask assembly 10 within gripping mechanism 34. In one embodiment, gripping mechanism 34 includes grip lock 50 that may be located on handle 32 or on gripping mechanism 34. Grip lock 50 may be used to lock gripping arm 36 in a fixed position to prevent the accidental release of photomask assembly 10 from gripping pad 38.

First protective cover 40 may be made of a transparent material, a partially transmissive material, an opaque material, plastic, polypropylene, acrylic, crystal, metal, glass, carbon fiber, silica, quartz, or any materials and/or combination of materials that may be used to prevent contaminants from reaching photomask assembly 10. In some embodiments, first protective cover 40 may be made from a transparent plastic material that allows photomask assembly 10 or components to be used with a manufacturing tool with the cover placed over photomask assembly 10.

In certain embodiments, first protective cover 40 may be detachably connected to a photomask holder for easy cleaning or replacement of the cover. Once first protective cover 40 is attached to photomask holder 30, first protective cover 40 may retractably extend over photomask assembly 10. Placing protective cover 40 over a portion of photomask assembly 10 may aid in preventing damage to photomask assembly 10 or components while being handled in a mask shop. For other embodiments, a photomask holder may be formed in accordance with teachings to the present invention without a protective cover.

First protective cover 40 may be placed over photomask assembly 10 to protect patterned layer 18 of pellicle 14 from damage while photomask assembly 10 is being transported around a manufacturing facility. Typically, first protective cover 40 extends slightly beyond the edges of photomask assembly 10 in all directions. In some embodiments, first protective cover 40 forms a protective border around photomask assembly 10 that extends beyond the edges of photomask assembly 10 approximately one-half inches to one-inch.

Another type of damage may occur if particulate matter lands on a surface of photomask assembly 10 or an associated component. To prevent unnecessary attraction of dust and other particulate matter, first protective cover 40 may be made of anti-static material, such as static dissipative material (e.g., Poly-MethylMethacrylate [PMMA]) or any inherently anti-static material. Incorporating an anti-static material as the protective cover prevents particulate matter that may cause damage to patterned layer 18 from being attracted to photomask assembly 10 or an associated component.

In further embodiments, gripping mechanism 34 may also include selector switch 44. Selector switch 44 may be located on gripping mechanism 34 or alternatively located on handle 32. Once gripping pad 38 engages photomask assembly 10 or an associated component, selector switch 44 may be used to place first protective cover 40 over photomask assembly 10 or an associated component by sliding selector switch 44 along top path 47.

In certain embodiments, photomask holder 30 further includes second protective cover 42. Second protective cover 42 may prevent scratches or contaminants from damaging the uncoated side of substrate 16 or an associated component. Prevention of scratches and contamination is desirable since any scratch or contaminate on substrate 16 may be projected on a wafer and affect a circuit pattern of a semiconductor device. Second protective cover 42 may be made from the same material as first protective cover 40, but second protective cover 42 also may be made from any suitable material for protecting photomask assembly 10. Second protective cover 42 may also be associated with selector switch 44.

Selector switch 44 may have different orientations that allow selector switch 44 to independently extend second protective cover 42 separately from first protective cover 40. Second protective cover 42 may be extended independently from first protective cover 40 by sliding selector switch 44 along bottom path 48. Alternatively, selector switch 44 may extend both first protective cover 40 and bottom protective cover 42 by sliding selector switch 44 along middle path 46. In certain embodiments, selector switch 44 includes protective cover lock 52. Protective cover lock 52 may be used to prevent the movement of first and second protective covers 40 and 42. By locking first and second protective covers 40 and 42 in place, accidental exposure of photomask assembly 10 or an associated component may be prevented during transport of photomask assembly 10.

Side protective covers (not expressly shown) may also be associated with photomask assembly holder 30. Side protective covers may be independent from or form a part of first protective cover 40 or second protective cover 42. The side protective covers may be formed from the same material as top protective cover 40 or bottom protective cover 42, but also may be made from any suitable material for protecting photomask assembly 10. Once extended around photomask assembly 10, side protective covers may protect the edges of photomask assembly 10.

In alternative embodiments, first protective cover 40 and second protective cover 42 may be added to any wafer or photomask handling tool, or may be used to protect any other object that can be damaged by scratches or contaminants. For example, the retractable protective covers may be added to a conventional silicon wafer handling tool to prevent contaminants from reaching either surface of a wafer during transportation within a semiconductor manufacturing facility. Once the wafer is placed in a processing tool, one or all of the protective covers may be retracted to expose the wafer.

FIG. 3 illustrates a flow diagram of a method for transporting photomask assembly 10 between manufacturing tools using photomask holder 30. At step 60, photomask assembly 10 in a first manufacturing tool may be placed within gripping mechanism 34 of photomask holder 30. After positioning photomask assembly 10 within gripping mechanism 34 of photomask holder 30, grip lock 50 may be used to lock gripping mechanism 34 in place to prevent an accidental release of photomask assembly 10 or an associated component. In one embodiment, photomask holder 30 includes only first protective cover 40. In another embodiment, photomask holder 30 further includes second protective cover 42 used to protect another side of photomask assembly 10 or an associated component. In a further embodiment, photomask holder 30 further includes side protective covers (not shown) that may be formed as a part of first protective cover 40 or second protective cover 42.

At step 62, first protective cover 40 may be extended over photomask assembly 10 or an associated component. Protective cover lock 52 may also be used to lock the covers in the extended position. Locking the protective covers around or over photomask assembly 10 prevents accidental retraction of the covers, which may damage photomask assembly 10 or an associated component.

At step 64, photomask assembly 10 or an associated component is removed from the first manufacturing tool. In some embodiments, second protective cover 42 and side protective covers may be further extended to protect photomask assembly 10 or an associated component. First protective cover 40 may be locked into place utilizing protective cover lock 52. At step 66, photomask assembly 10 or an associated component is transported to a second manufacturing tool. Photomask holder 30 may be used by either a person or a machine to carry photomask assembly 10 to the second manufacturing tool. In particular embodiments, a mechanical pick may be used to transport photomask assembly 10 or an associated component. Mechanical picks may utilize a mechanical arm to function as handle 32 that couples with gripping mechanism 34 to manipulate photomask assembly 10 or an associated component.

At step 68, photomask assembly 10 or an associated component is set in the second manufacturing tool. In certain embodiments, second protective cover 42 and side protective covers may be retracted prior to placing photomask assembly 10 in the second manufacturing tool. Additionally, any locks, such as protective cover lock 52, may need to be released prior to retracting second protective cover 42 and side protective covers. After being placed in the second manufacturing tool, photomask holder 30 may release and remove gripping mechanism 34 from around photomask assembly, at step 70. In one embodiment, photomask holder 30 may retract first protective cover 40 before releasing and removing photomask assembly 10 or an associated component.

The second manufacturing tool may then perform a manufacturing procedure on photomask assembly 10 or an associated component. The manufacturing procedure may include exposing photomask assembly 10 or an associated component, or a semiconductor wafer in a lithographic procedure, testing, cleaning, storing of photomask assembly 10, or any suitable manufacturing procedure that utilizes photomask assembly 10 or an associated component. In one embodiment, photomask assembly 10 may be held within photomask holder 30 with first protective cover 40 placed over photomask assembly 10 during the manufacturing procedure.

Although the present invention has been described with respect to a specific preferred embodiment thereof, various changes and modifications may be suggested to one skilled in the art and it is intended that the present invention encompass such changes and modifications that fall within the scope of the appended claims.

What is claimed is:

1. A photomask holder comprising:

a gripping mechanism operable to engage and retain a photomask within the photomask holder;

a handle coupled to the gripping mechanism operable to manipulate the gripping mechanism, the gripping mechanism including at least two gripping arms that oppose each other; and a protective cover associated with the gripping mechanism, the protective cover operable to protect the photomask while engaged within the photomask holder.

2. The photomask holder of claim 1, wherein the protective cover comprises a cover located over a first surface of the component.

3. The photomask holder of claim 2, wherein the protective cover further comprises a cover located under a second surface of the component.

4. The photomask holder of claim 1, further comprising a first protective cover and a second protective cover.

5. The photomask holder of claim 1, wherein the handle comprises:
- a locking mechanism operable to prevent manipulation of the gripping mechanism; and
- the locking mechanism including a locked position to prevent the gripping mechanism from moving and an unlocked position to allow the gripping mechanism to move.

6. The photomask holder of claim 1, further comprising a selection mechanism associated with the handle, the selection mechanism operable to retractably extend the protective cover over the component.

7. The photomask holder of claim 6, wherein the selection mechanism includes a selector switch operable to independently position a first protective cover and a second protective cover around the component.

8. The photomask holder of claim 1, wherein the protective cover comprises an anti-static material.

9. The photomask holder of claim 1, wherein the protective cover comprises a transparent material.

10. The photomask holder of claim 1, wherein the protective cover is detachably coupled to the photomask holder.

11. The photomask holder of claim 1, further comprising a locking mechanism coupled to the handle, the locking mechanism providing both a locked position to prevent the protective cover from moving and an unlocked position to allow the protective cover to move.

12. The photomask holder of claim 1, wherein the protective cover comprises a side cover located over at least one side of the component.

13. A photomask holder comprising:
- a mechanical pick operable to engage and retain a photomask within the mechanical pick; and
- a first protective cover coupled to the mechanical pick located proximate a first surface of the photomask extendably operable to enclose the photomask while engaged within the photomask holder.

14. The photomask holder of claim 13, further comprising a second protective cover located proximate a second surface of the photomask.

15. The photomask holder of claim 14, further comprising a selection mechanism associated with the mechanical pick, the selection mechanism including a selector switch operable to independently position the first protective cover and the second protective cover over the photomask.

16. The photomask holder of claim 13, wherein the first protective cover comprises an anti-static material.

17. The photomask holder of claim 13, wherein the first protective cover comprises a transparent material.

18. The photomask holder of claim 13, wherein the protective cover detachably couples to the mechanical pick.

19. The photomask holder of claim 13, wherein the mechanical pick comprises:
- a gripping mechanism including at least two gripping arms that oppose each other; and
- a handle coupled to the gripping mechanism operable to manipulate the gripping mechanism.

20. The photomask holder of claim 19, further comprising a locking mechanism associated with the gripping mechanism, the locking mechanism including a locked position operable to prevent the gripping mechanism from being manipulated and an unlocked position operable to allow the gripping mechanism to be manipulated.

21. The photomask holder of claim 19, further comprising a locking mechanism associated with the handle, the locking mechanism operable to prevent the protective cover from moving when in a locked position.

* * * * *